United States Patent
Park et al.

[11] Patent Number: 6,137,162
[45] Date of Patent: Oct. 24, 2000

[54] CHIP STACK PACKAGE

[75] Inventors: Sang Wook Park, Kyoungki-do; Sung Bum Park, Seoul, both of Rep. of Korea

[73] Assignee: Hyundai Electronics Industries Co., Ltd., Kyoungki-do, Rep. of Korea

[21] Appl. No.: 09/307,657

[22] Filed: May 10, 1999

[30] Foreign Application Priority Data

May 12, 1998 [KR] Rep. of Korea ................... 98-16880

[51] Int. Cl.[7] .................................................. H01L 23/48
[52] U.S. Cl. ..................... 257/685; 257/686; 257/786; 257/723; 257/724; 438/107; 438/111; 438/612
[58] Field of Search .................................. 257/685, 686, 257/786, 723, 724; 438/107, 109, 112, 111, 612

[56] References Cited

U.S. PATENT DOCUMENTS

| | | | |
|---|---|---|---|
| 4,764,846 | 8/1988 | Go | 257/676 |
| 5,327,327 | 7/1994 | Frew et al. | 361/784 |
| 5,343,366 | 8/1994 | Cipolla et al. | 361/785 |
| 5,376,756 | 12/1994 | Kwon | 257/676 |
| 5,514,905 | 5/1996 | Sakuta et al. | 257/666 |
| 5,514,907 | 5/1996 | Moshayedi | 257/723 |
| 5,600,541 | 2/1997 | Bone et al. | 361/707 |
| 5,612,570 | 3/1997 | Eide et al. | 257/686 |
| 5,686,762 | 11/1997 | Langley | 257/775 |
| 5,728,601 | 3/1998 | Sato et al. | 438/109 |
| 5,781,413 | 7/1998 | Howell et al. | 361/777 |
| 5,818,107 | 10/1998 | Pierson et al. | 257/723 |
| 5,821,625 | 10/1998 | Yoshida et al. | 257/777 |
| 5,847,446 | 12/1998 | Park et al. | 257/666 |
| 5,940,277 | 8/1999 | Farnworth et al. | 257/678 |

*Primary Examiner*—Mary Wilczewski
*Assistant Examiner*—Yung A. Lin
*Attorney, Agent, or Firm*—Ladas & Parry

[57] ABSTRACT

Disclosed is a chip stack package having a remarkably short interconnection paths between the semiconductor chips and external device, and between the respective semiconductor chips. The chip stack package comprises: at least two semiconductor chips disposed in series vertically in the package, wherein bonding pads are disposed at both sides of the respective semiconductor chips and vertically open slots are formed in the bonding pads; lead frames inserted into the slots of the respective semiconductor chips so as to electrically connect the respective bonding pads; and an epoxy compound for molding the resultant structure entirely so as to expose an interconnection portion of the respective lead frames.

9 Claims, 8 Drawing Sheets

{CHIP STACK PACKAGE}

CHIP STACK PACKAGE

FIELD OF THE INVENTION

This invention relates to a chip stack package, more particularly to a chip stack package in which a plurality of semiconductor chips are stacked.

BACKGROUND OF THE INVENTION

Description of the Related Art

According to recent trend of reducing the size of cellular or mobile phones and other communication devices, chip stack packages having higher memory capacitance within a limited chip size have been used.

FIG. 1 exemplifies a typical chip stack package. Referring to FIG. 1, it is seen that at least two layers of packages are stacked in the chip stack package and the respective packages have semiconductor chips therein. The stack chip package as in FIG. 1 has a structure that unit packages 10, 20 are electrically connected each other by means of a guide 15 attached to one side of unit packages 10,20. Solder joints(not shown) are provided between outer leads 11,21 of the unit packages 10,20 and the guide 15 for the electric connection between unit packages.

In the package as shown in FIG. 1, there are, however, drawbacks in junction reliability of the solder joints for electrically connecting the unit packages 10, 20. And, also the electric signal transmission in the chip stack package delays rather than in a chip size package. Moreover, a conventional chip stack package should include a heat sink for dissipating heat generated during operation of the package and it is impossible to stack in a chip size package shape.

As a complement to foregoing drawbacks, another chip stack packages as in FIGS. 2a and 2b are presented. Referring to FIG. 2a, a chip stack package 30 has a structure that semiconductor chips 31, 32 stacked each other are connected to a lead frame 35 by means of a tape automated bonding 33 (hereinafter "TAB"). On the other hand, referring to FIG. 2b, a chip stack package 30a has a structure that semiconductor chips 31, 32 are connected to a lead frame 35 by means of a bonding wire 37. Reference numeral 29 in FIGS. 2a and 2b is a epoxy compound.

As noted in the chip stack packages of FIGS. 2a and 2b, since a TAB or a bonding wire is used for connecting the semiconductor chips and lead frame, electric signal path is enlarged and therefore the electric characteristics of chip stack package is degraded. Furthermore, the dissipating mechanism of chip stack package is very complicated and the heat dissipation is not performed enough. The chip stack packages of FIGS. 2a and 2b are hardly applied due to those drawbacks.

SUMMARY OF THE INVENTION

Accordingly, it is one object of the present invention to provide a chip stack package having short electric interconnections between semiconductor chips and external devices related thereto, and between semiconductor chips.

It is another object of the present invention to provide a chip stack package having excellent dissipating properties.

The chip stack package according to the present invention includes at least two semiconductor chips which are stacked. Bonding pads are arranged at both edges of the respective semiconductor chips. Slots having open top and bottom are formed in the bonding pad. Lead frames are inserted into the bonding pad slots and the respective bonding pads are electrically connected by the lead frames. The entire resultant is molded with an epoxy compound so as to expose bottoms of the respective lead frames.

DETAILED DESCRIPTION OF THE PREFERRED EMBODIMENTS

Figure 1:
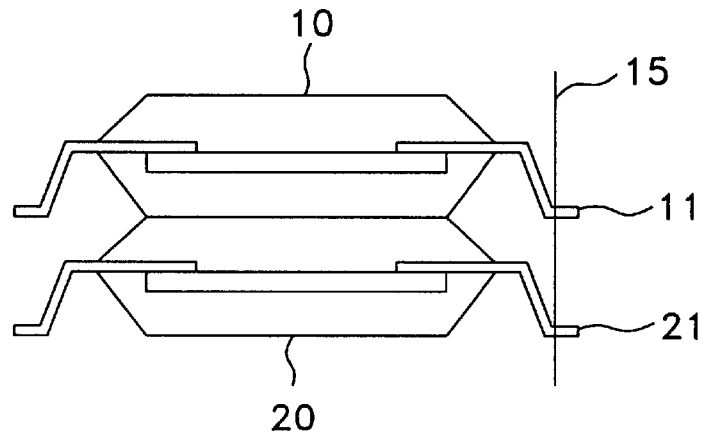
FIG. 1 is a cross-sectional view for showing a conventional chip stack package.
Figure 2A:
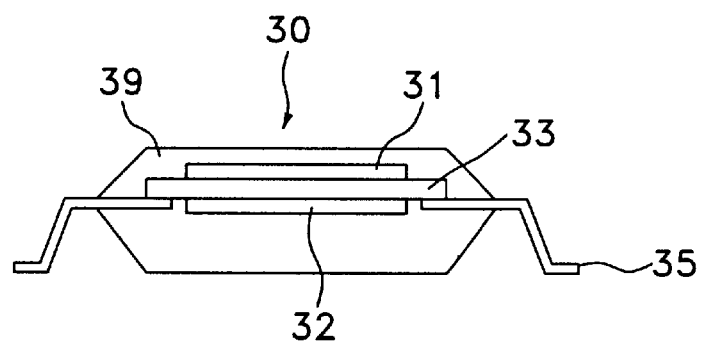
FIGS. 2a and 2b are cross-sectional views for showing another conventional chip stack package.
Figure 2B:
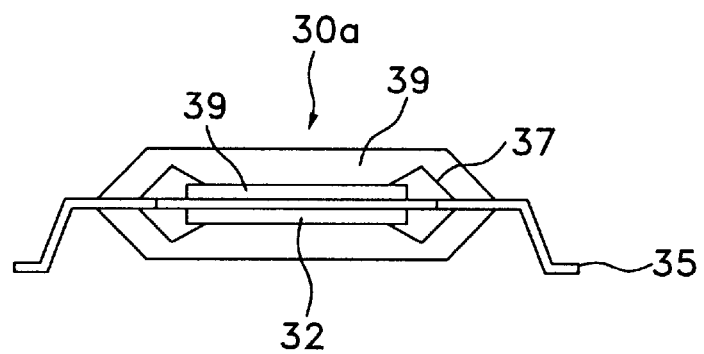
Figure 3:
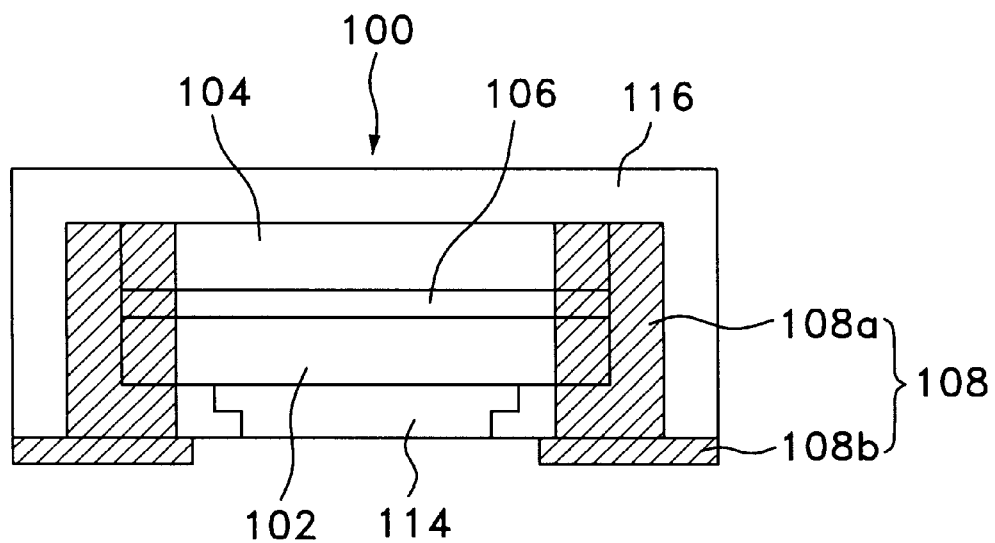
FIG. 3 is a cross-sectional view for showing a chip stack package according to a first embodiment of the present invention.

FIG. 3 is a cross-sectional view for showing a chip stack package according to a first embodiment of the present invention. Referring to FIG. 3, a chip stack package 100 includes a first semiconductor chip 102 and a second semiconductor 104, the semiconductor chips 102, 104 are stacked successively by means of an adhesive layer 106.

As for the adhesive layer 106, TAB, thermosetting resin, anisotropic conductive film (hereinafter "ACF") or anisotropic conductive adhesive(hereinafter "ACA") can be used. Among them, as will be described later, the TAB is electrically connected to solder when the solder is re-flowed to a bonding pad of a semiconductor chip since the TAB includes a conductive circuit therein, and the TAB acts as a ground plane for eliminating electrical noise. Accordingly, the TAB is often desirable for packages to improve electric characteristics thereof.

The TAB as described above, includes at least 3 layers. Top and bottom layers are made of an adhesive material for attaching the respective semiconductor chips 102,104. A middle layer is made of a conductive material and is electrically connected to the respective semiconductor chips 102,104 whereby the middle layer acts as power or ground plane. As for the adhesive material of the top and bottom layer of the TAB, an epoxy based thermoplastic resin, an adhesive glass or an adhesive tape can be used. In case of the adhesive tape, thickness of the tape is set in the range of 10~100 µm and is preferably made of an insulating polymer. A conductive layer, i.e. the middle layer of the TAB has a plate or a net structure that includes single or multiple layer. Further, the conductive layer is composed of metal lines that are selected from groups preferably consisting of Cu/Ni/Au, Cu/Ni/Cr/Au, Cu/Ni/Co/Au, Cu/Ni/Sn/Au, Cu/Ni/Cr/Au/An or Cu/Ni/Co/Au/Sn. The thickness of the metal line is set in the range of 1 mil~4 mils preferably. An anisotropic conductor is coated in the conductive layer for adherence and electric connection with peripheral circuits according to the methods of stencil, screen printing, dispensing, stamping or lamination. The anisotropic conductor is made of an adhesive material containing conductive particles. Herein, for the adhesive material, an epoxy resin, a silicon resin, a phenoxy resin, polyurethane, polysulfide or other thermosetting polymers can be selected. In addition, as for the conductive particles, Ag, Au, Ni, In, Sn or Indium Tin Oxide("ITO") can be used. The size of conductive particle is set in the range of 3~20 μm and has various shapes, such as sphere, quadrilaterals, triangles, cubes, quadrilateral pyramid or pyramid frustum. Also, the conductive particles may have a structure that an internal polymer is covered by the external conductive metal.

Figure 4:
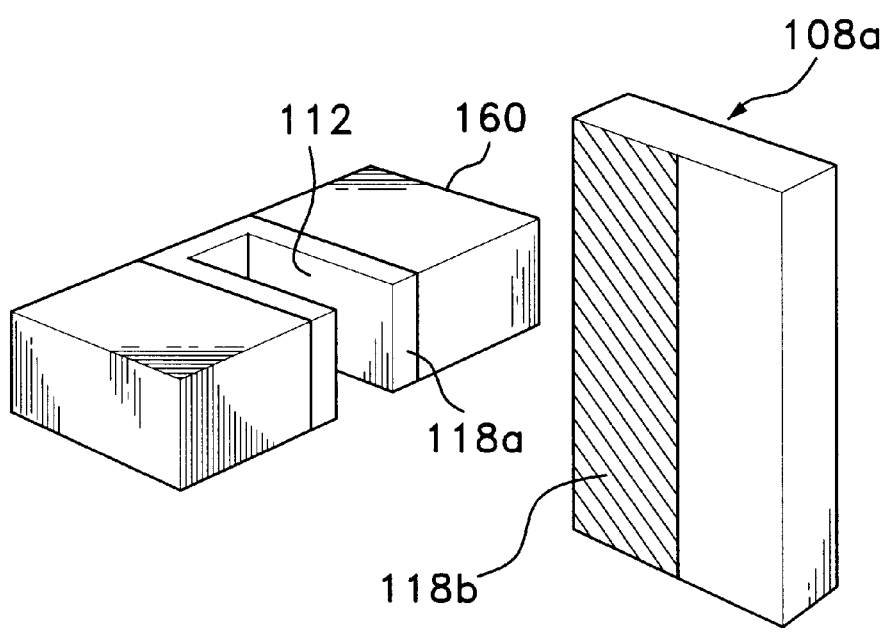
FIG. 4 is a partial perspective view for illustrating the attachment of lead frame in the package according to FIG. 3.

On the other hand, a bonding pad 160 as shown in FIG. 4 are formed at both sides of the first and second semiconductor chips 102, 104. The bonding pad 160 is made of aluminum and the size is predetermined at minimum of 15 μm×15 μm and at maximum of 500 μm×500 μm. Slots 112 having open top and bottom ends are formed in the bonding pad 160. The slots 112 in the first embodiment of the present invention are rectangular shape.

Lead frames 108 are inserted into the slots 112. The respective bonding pads 160 are electrically connected each other by the lead frames 108. The respective lead frames 108 include a vertical lead 108a to be inserted into the slots 112 and a horizontal lead 108b which is formed below the vertical lead 108a and is electrically connected to an external device, for instance, a printed circuit board. Accordingly, the vertical lead 108a is shaped corresponding to the shape of the slots 112 to stick the vertical lead 108a of the lead frames 108 in the entire inner surface of the slots 112 closely. That means, the vertical lead 108a is shaped of a rectangular solid whose height is relatively greater than width thereof and the width is equal to that of the slots 112. Further, solder 118a and 118b are coated over inner surface of the slots 112 and contact face of the vertical lead 108a to the slots 112 for strengthening adhesion intensity therebetween.

Returning to FIG. 3, to an exposed surface of the first semiconductor chip 102, i.e. a bottom surface is attached a heat sink 114 for outwardly dissipating heat generated from the first and second semiconductor chips 102,104. To protect and to insulate the first and second semiconductor chips 102,104 and the lead frames 108, the entire resultant structure is molded with an epoxy compound 116 such that bottom surfaces of the respective vertical leads 108b and the heat sink 114 are exposed only.

The chip stack package as constituted above according to the first embodiment has very short interconnection paths of the respective semiconductor chips 102,104 and the external devices, and the semiconductor chips 102,104 therebetween since the bonding pads 160 are electrically connected by the lead frames 108 being disposed in straight line type at both sides of the semiconductor chips 102,104. Moreover, high temperature of heat generated from the semiconductor chips is dissipated outwardly by the heat sink 114 attached to the exposed surface of the first semiconductor chip 102.

Figure 5:
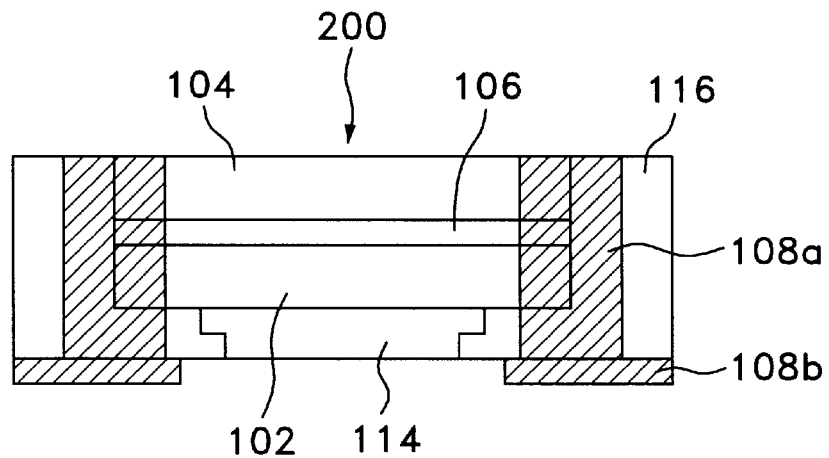
FIG. 5 is a cross-sectional view for showing a chip stack package according to a second embodiment of the present invention.

FIG. 5 shows a chip stack package 200 according to a second embodiment. In the chip stack package 200 of FIG. 5, top surface of a second semiconductor chip 104 is exposed from the epoxy compound 116. According to this exposure, the package 200 has an advantage of easy dissipation of heat generated from the respective semiconductor chips 102,104. So as not to expose upper of the vertical lead 108a outwardly, As the upper of the vertical lead 108a is set in the same level with surfaces of the second semiconductor chip 104 and the epoxy compound 116.

Figure 6:
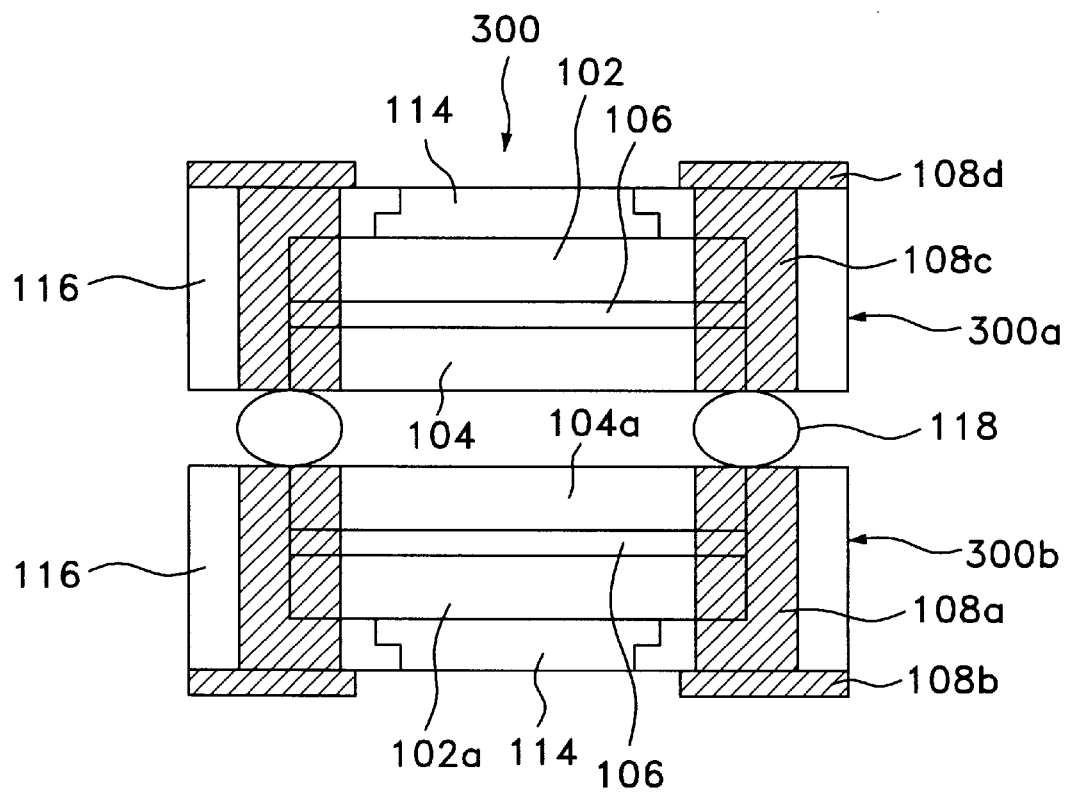
FIG. 6 is a cross-sectional view for showing a chip stack package according to a third embodiment of the present invention.

FIG. 6 shows a chip stack package 300 according to a third embodiment. In the chip stack package 300 of FIG. 6, two packages shown in FIG. 5 are stacked opposite each other. That means, the second semiconductor chip 104 of a first unit package 300a in upper position is disposed opposite to the second semiconductor chip 104a of a second unit package 300b in lower position. Accordingly, the vertical leads 108c, 108a of the first and second unit packages 300a, 300b are disposed opposite respectively. As constituted above, the respective vertical leads 108c, 108a are electrically connected by solder balls 118 whereby totally four semiconductor chips 102,104,104a,102a being electrically connected each other are stacked. Herein, the reference numeral 108d stands for a horizontal lead of the first unit package 300a.

Figure 7:
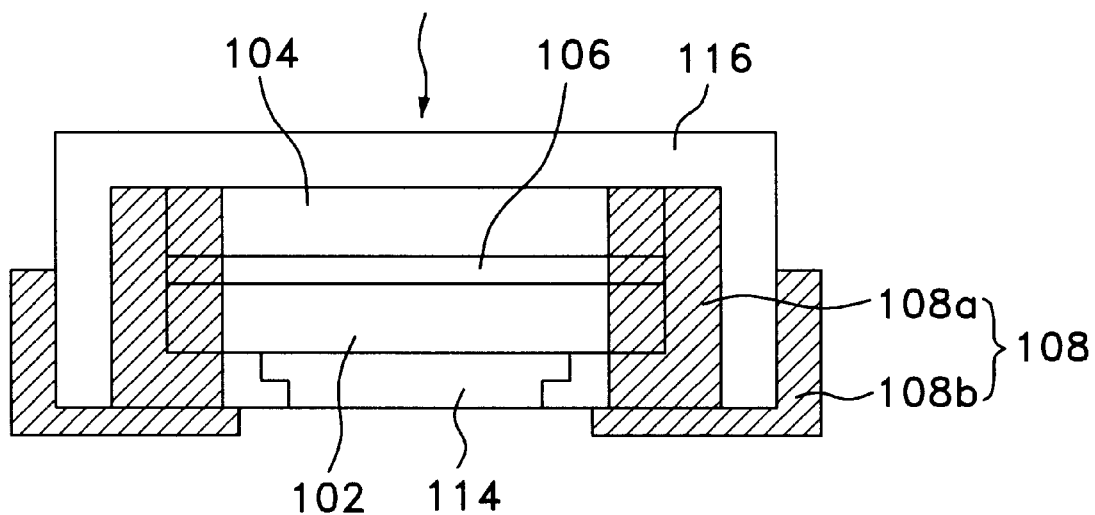
FIG. 7 is a cross-sectional view for showing a chip stack package according to a fourth embodiment of the present invention.

FIG. 7 shows a chip stack package 400 according to a fourth embodiment. The chip stack package 400 of FIG. 7 is a modified example of the chip stack package 100 of FIG. 3, in which only the horizontal lead 108b is modified. That mean, an outer end of the horizontal lead 108b is extended to sides of the epoxy compound 116. The package as constituted above has the advantage of enhanced package-mounting property since the horizontal lead 108b increases a contact area to the PCB contact region.

Figure 8:
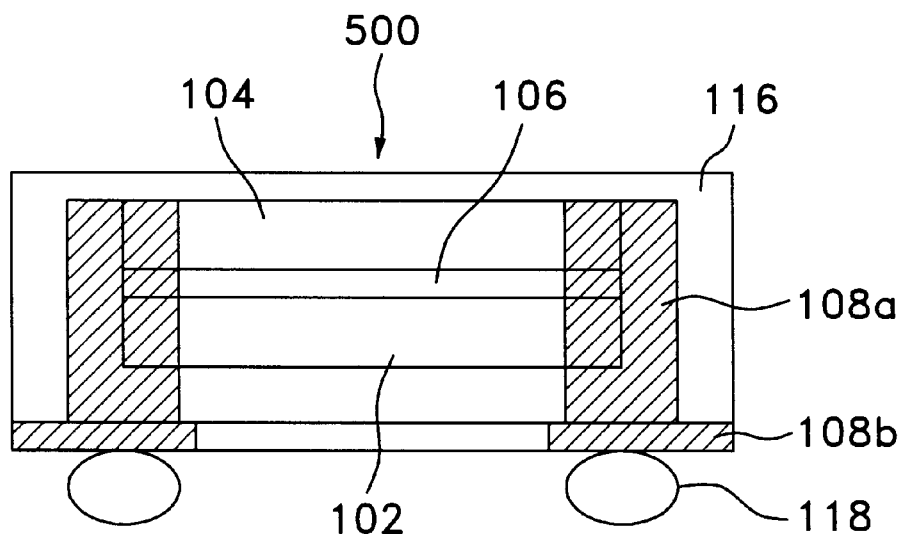
FIG. 8 is a cross-sectional view for showing a chip stack package according to a fifth embodiment of the present invention.

FIG. 8 shows a chip stack package 500 according to a fifth embodiment. The difference between the chip stack package 100 in FIG. 3 and the package 500, is the existence of heat sink, the package 500 has no heat sink. In this case, i.e. without a heat sink, the thickness as much as that of the heat sink can be reduced in the package 500. Furthermore, the package 500 is shaped of a flip chip, a structure that the package 500 is directly mounted on the PCB or is inserted into an MCM or a ceramic package by mounting solder balls 118 on the bottom of horizontal lead 108b being exposed from the epoxy compound 116.

Meanwhile, two semiconductor chips are stacked in the above described embodiments. However, three or more semiconductor chips can be stacked to constitute a package.

Figure 9A:
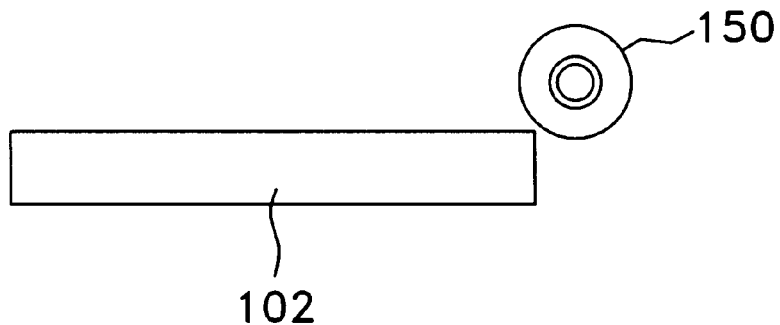
FIGS. 9 to 15 are schematic views for illustrating manufacturing process according to the package of FIG. 3.
Figure 9B:
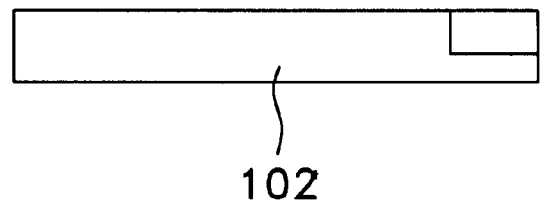
Figure 9C:
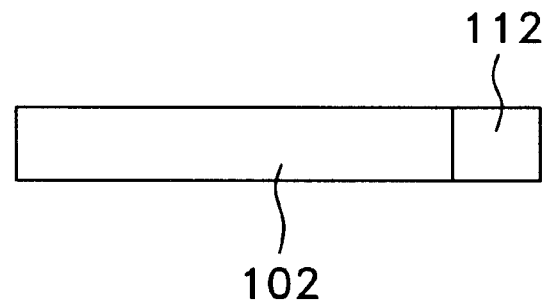

A manufacturing method of a package according to the first embodiment follows. As shown in FIG. 9a, a sawing wheel 150 made of diamond is disposed on one side of the first semiconductor chip 102 provided with bonding pads. Half of the thickness of the bonding pads is removed by the sawing wheel 150 and semi-slots are formed as shown in FIG. 9b. Afterward, an entire bottom region of the first semiconductor chip 102 is polished by remaining thickness of the bonding pads so that bottoms of the semi-slots are exposed thereby forming vertically open slots 112 on the bonding pads. Although not shown in the drawings, on the other side of the bonding pads of the first semiconductor chip 102 are formed slots according to the same method as described. And also in the respective bonding pads of the second semiconductor chip are formed slots.

Figure 10A:
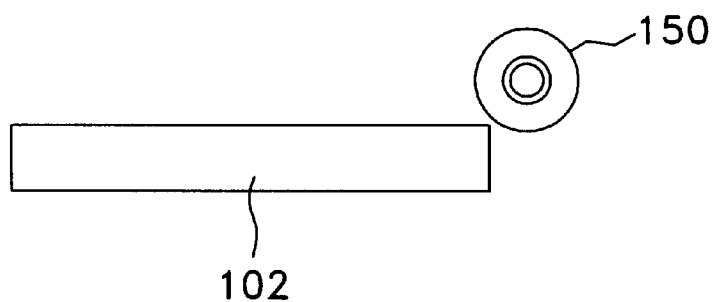
Figure 10B:
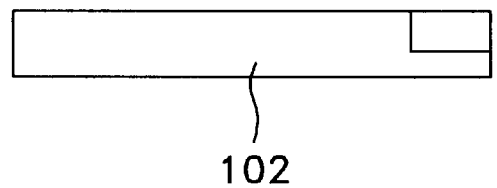
Figure 10C:
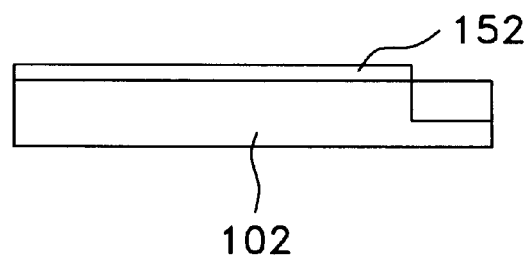
Figure 10D:
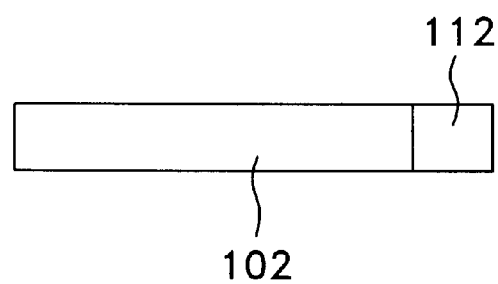
Figure 11:
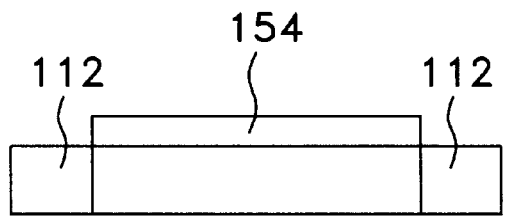

FIGS. 10a to 10d show another method of forming slots in bonding pad. The procedures according to FIGS. 10a to 10b are same as that according to FIGS. 9a to 9b. An etching mask 152 is formed on a surface of the first semiconductor chip 102 so as to expose the semi-slots as shown in FIG. 10c. Next, referring to FIG. 10d, the semi-slots are etched by means of the etching mask 152 thereby forming slots 112 on the bonding pads.

After forming slots 112 by the selected method between the two methods, a spray mask 154 is formed on the semiconductor chip 102 so as to expose the slots 112. And then, according to a spray, PVD or CVD method, solder is coated at the entire inner surface of the slots 112 by using the spray mask 154. The same procedure is conducted in the second semiconductor chip.

Figure 12:
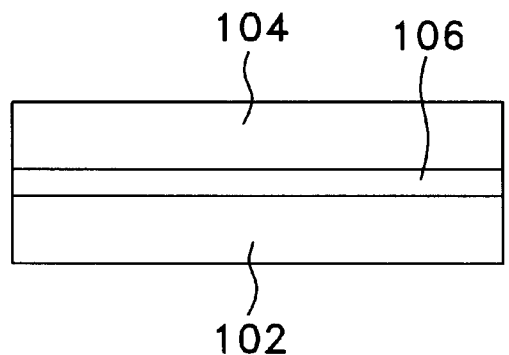
Figure 13:
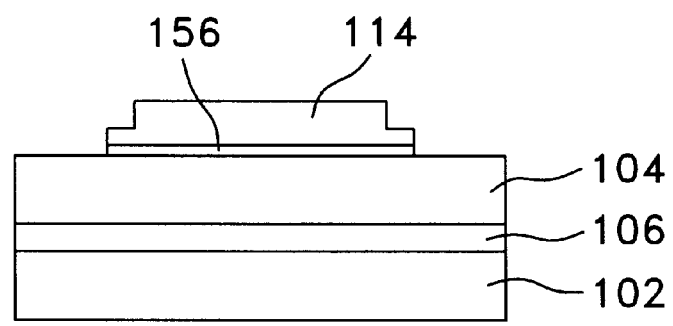

Afterward, as shown in FIG. 12, two semiconductor chips 102,104 are stacked by attaching the first and second semiconductor chips 102,104 by means of an adhesive material 106.

And next, a heat sink 114 is attached to the exposed surface of the second semiconductor chip 104 by means of an epoxy 156. Herein, the heat sink 114 can be positioned at the bottom of the exposed surface of the first semiconductor chip 102 likewise FIG. 3.

Figure 14:
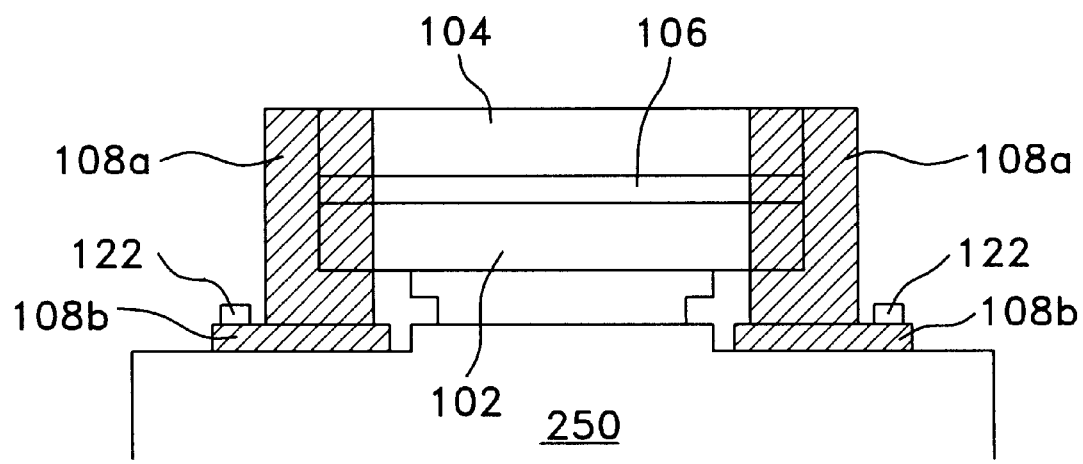

Afterward, referring to FIG. 14, the vertical leads 108a of the lead frames 108 shaped as above described figure are inserted each slot 112 and therefore the bonding pads of the respective semiconductor chips 102,104 are electrically connected. Solder for improving the adhesion stability with the inner surface of the slots 112 is already coated on the respective vertical leads 108a.

Figure 15:
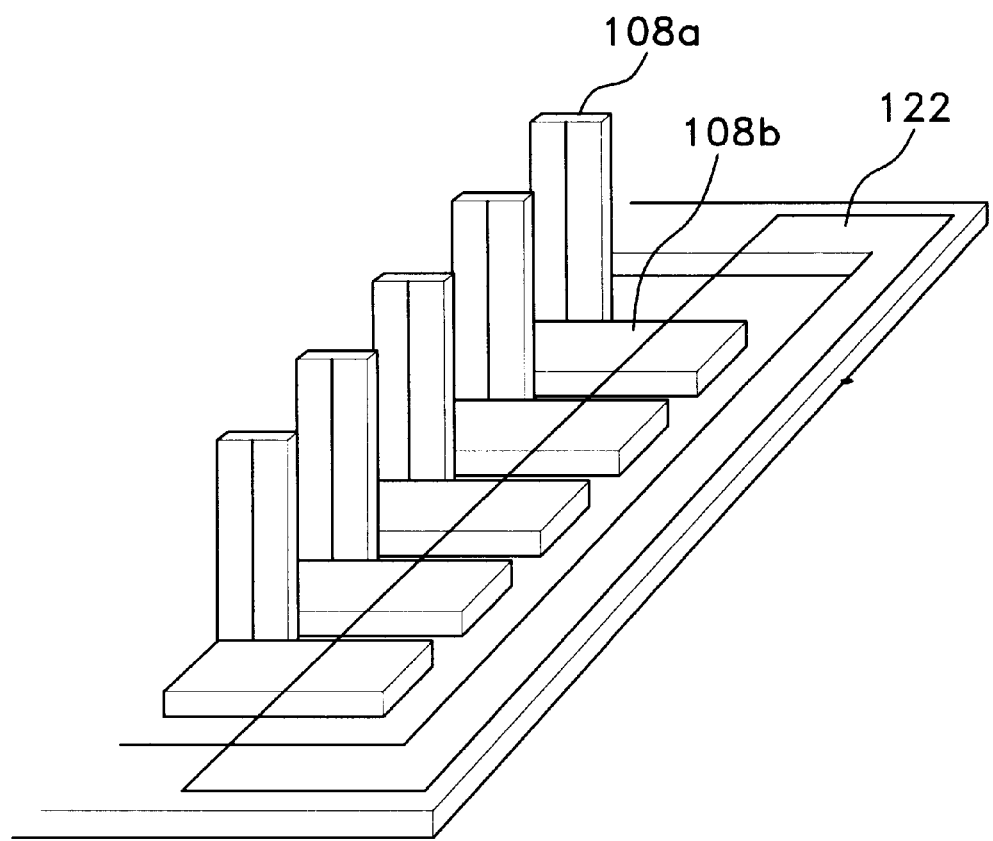

FIG. 15 is a perspective view of one side where a plurality of the lead frames 108 are mounted, and left and right of the other side is arranged symmetric thereto. Meanwhile, reference numeral 122 in FIGS. 14 and 15 stands for an adhesive tape for securing the horizontal leads 108b of the lead frames 108.

Afterward, the resultant structure of FIG. 14 is positioned on a heater block 250 and is heated. Simultaneously, a conductive material such as a solder paste or an ACA is injected between the inner surface of the slots 112 and the vertical leads 108a. As for the injecting method, the conductive material is injected into the inner surface of the slots under vacuum condition. By exposing under the atmospheric pressure, the conductive material is completely injected into the inner surface of the slots due to the difference in pressure.

Next, the resultant is re-flowed at temperature of approximately 175° C. and bonding pads of the first and the second semiconductor chips 102,104 and the lead frames 108 are completely bonded electrically and mechanically.

Finally, only to expose bottoms of the horizontal lead 108b of the lead frames 108 and the heat sink 114, the entire. structure is molded with epoxy compound 116, and afterward it is separated respectively according to a singulation process. The chip stack package shown in FIG. 3 is accomplished.

Although foregoing description is only directed to the package of FIG. 3 according to the first embodiment, those skilled in the art, however, can easily perform the package of FIGS. 4 to 8 according to the second to fifth embodiments of the present invention from the above description. Therefore, description of the method of manufacturing package according to the embodiments 2 to 5 will be omitted.

As described above, in the chip stack packages according to the present embodiments, semiconductor chips and external device are electrically connected by the linear lead frames positioned at both sides of the respective semiconductor chips. Therefore, interconnection paths between the semiconductor chips and external device, and between the respective semiconductor chips, are remarkably shortened. Consequently, electric property of the chip stack package is improved.

Further, heat generated within semiconductor chips is easily dissipated outwardly since the heat sink is attached to the exposed surface of the semiconductor chip.

Various other modifications will be apparent to and can be readily made by those skilled in the art without departing from the scope and spirit of the present invention. Accordingly, it is not intended that the scope of the claims appended hereto be limited to the description as set forth herein, but rather that the claims be broadly construed.

What is claimed is:

1. A chip stack package comprising:
    at least two semiconductor chips attached in series vertically in the package, wherein bonding pads are disposed at both sides of the respective semiconductor chips and vertically open slots are formed in the bonding pads;
    lead frames inserted into the slots of the respective semiconductor chips so as to electrically connect the respective bonding pads; and
    an epoxy compound for molding the resultant structure entirely so as to expose an interconnection portion of the respective lead frames.

2. The chip stack package of claim 1, wherein a heat sink is attached to one exposed surface of the semiconductor chips, and the heat sink is exposed from the epoxy compound.

3. The chip stack package of claim 1, wherein one outer surface of the semiconductor chips is exposed from the epoxy compound.

4. The chip stack package of claim 1, wherein the lead frames further comprise a vertical lead inserted into the respective slots; and a horizontal lead connected to one side of the vertical lead.

5. The chip stack package of claim 4, wherein another side of the vertical lead is exposed from the epoxy compound, and two unit packages having two semiconductor chips stacked therein is opposed to the another side of the respective vertical lead exposed from the epoxy compound, therefore the opposing vertical leads are electrically connected by solder balls.

6. The chip stack package of claim 4, wherein the horizontal lead is extended to sides of the epoxy compound.

7. The chip stack package of claim 4, wherein solder balls are mounted on the one side of the horizontal lead.

8. The chip stack package of claim 1, wherein the semiconductor chips are attached by means of an adhesive material which is selected from a group consisting of a TAB, a thermosetting region, an ACF and an ACA.

9. The chip stack package of claim 1, wherein solder is coated at inner surface of the slots and at a contact face of the lead frames to the inner surface of the slots.

* * * * *